United States Patent [19]
Takahashi

[11] Patent Number: 5,989,951
[45] Date of Patent: Nov. 23, 1999

[54] SEMICONDUCTOR DEVICE WITH CONTACTS FORMED IN SELF-ALIGNMENT

[75] Inventor: Toshifumi Takahashi, Tokyo, Japan

[73] Assignee: NEC Corporation, Tokyo, Japan

[21] Appl. No.: 08/634,414

[22] Filed: Apr. 18, 1996

[30] Foreign Application Priority Data

Apr. 20, 1995 [JP] Japan .................................. 7-095257

[51] Int. Cl.$^6$ .............................................. H01L 21/8242
[52] U.S. Cl. ........................ 438/239; 438/586; 438/229; 438/303
[58] Field of Search .................................. 438/229, 230, 438/231, 232, 233, 303, 305, 307, 239, 287, 595, 238, 624, 586; 148/FOR 168, FOR 216, FOR 217; 365/624

[56] References Cited

U.S. PATENT DOCUMENTS

| | | | |
|---|---|---|---|
| 3,649,884 | 3/1972 | Haneta | 438/287 |
| 4,868,138 | 9/1989 | Chan et al. | 438/595 |
| 5,073,510 | 12/1991 | Kwon et al. | 438/297 |
| 5,187,114 | 2/1993 | Chan et al. | 438/238 |
| 5,296,399 | 3/1994 | Park | 438/241 |
| 5,335,196 | 8/1994 | Anzai | 365/149 |
| 5,429,979 | 7/1995 | Lee et al. | 438/253 |
| 5,536,674 | 7/1996 | Kosa et al. | 438/238 |
| 5,547,885 | 8/1996 | Ogoh | 438/286 |
| 5,563,088 | 10/1996 | Tseng | 438/253 |
| 5,578,524 | 11/1996 | Fukase et al. | 438/624 |
| 5,705,028 | 1/1998 | Matsumoto | 437/195 |
| 5,716,881 | 2/1998 | Liang et al. | 438/238 |
| 5,792,683 | 8/1998 | Hayashi et al. | 438/238 |

FOREIGN PATENT DOCUMENTS 2-163963  6/1990  Japan .

OTHER PUBLICATIONS

S. Subbanna et al., "A Novel Borderless Contact/Inter–connect Technology Using Aluminum Oxide Etch Stop for High Performance SRAM and Logic", *IEDM 93*, pp. 441–444.

Primary Examiner—Teresa M. Arroyo
Assistant Examiner—Khanh Duong
Attorney, Agent, or Firm—Sughru, Mion, Zinn Macpeak & Seas, PLLC

[57] ABSTRACT

In a method of manufacturing a semiconductor device, laminate structures with a first insulating film as a top film are formed on a semiconductor region having a first conductive type. One of the laminate structures is a gate electrode structure including a second insulating film as a gate insulating film formed on the semiconductor region, a conductive layer as a gate electrode formed on the gate insulating film, and the first insulating film formed on the gate electrode. Next, side wall insulating films are formed on side walls of the gate electrode structure and laminate structures adjacent to the gate electrode structure. Ion implantation of impurity of a second conductive type different from the first conductive type is executed using the side wall insulating films in a self-alignment manner to produce the source/drain regions for a metal-oxide-semiconductor (MOS) transistor. Contacts are formed for source/drain regions formed between the gate electrode structure and the adjacent laminate structures, using the side walls in a self-alignment manner.

23 Claims, 7 Drawing Sheets

5,989,951

SEMICONDUCTOR DEVICE WITH CONTACTS FORMED IN SELF-ALIGNMENT

BACKGROUND OF THE INVENTION

1. Field of the Invention

The present invention relates to a method for manufacturing a semiconductor device, and more particularly, to a method for manufacturing a semiconductor device with contacts formed in self-alignment manner.

2. Description of Related Art

A semiconductor integrated circuit formed on a semiconductor substrate such as a silicon substrate has been developed to be integrated with higher density. In a static random access memory (SRAM) as one of such integrated circuits, the memory capacity is increased from 4 Mbits to 16 Mbits and from 16 Mbits to a further more bits. In addition to the high density integration, high speed operation and low power consumption are required in the SRAM. In a large scale integrated circuit inclusive of not only the SRAM but also the dynamic random access memory (DRAM), many semiconductor elements need to be formed on a chip. The chip size needs to be reduced as small as possible from the viewpoints of the device cost and the product yield.

In the SRAM which has a complicated memory cell structure and needs fine processing, the chip size depends on the size of a memory cell. Therefore, in order to reduce the chip size, it is necessary to reduce the size of the memory cell. Specifically, it is very important to reduce the margin of a contact hole for a semiconductor circuit pattern in the memory cell, because many patterns such as diffusion layer patterns of transistors, gate electrode patterns, power supply line patterns and element isolation insulating film patterns, are formed in the memory cell and there are many contacts between these patterns. For this reason, it is desirable to form the contact holes in the semiconductor circuit pattern in self-alignment manner.

FIG. 1 is a plane pattern diagram of a conventional SRAM memory cell. This memory cell of a CMOS type is composed of 6 MOS transistors. FIGS. 2A to 2F are cross sectional views cut along a line A–A' of the SRAM memory cell shown in FIG. 1 in the manufacturing processes.

Referring to FIG. 1, active regions 102-1, 102-2, 103-1 and 103-2 surrounded by an element isolation insulating film 101-1 are formed on a P-type semiconductor (silicon) substrate or P-type well. Then, a gate electrode 104-1 for a drive MOS transistor and a gate electrode 104-2 for a load MOS transistor are provided and a word line 105-1 functioning as a gate electrode for a transfer MOS transistor is provided. N-type diffusion layers are formed as source/drain regions of the drive MOS transistor and load transfer MOS transistor by performing ion implantation of arsenic atoms as impurity into regions of the silicon active regions 102-1 and 102-2 where the above gate electrodes are not formed. Boron atoms as impurity are introduced by ion implantation into regions of the silicon active regions 103-1 and 103-2 where the gate electrodes are not formed, such that P-type diffusion layers are formed as the source/drain regions of the load MOS transistor. Thereafter, an interlayer insulating film is formed to cover the entire surface. Contact holes 106-1 and 106-2 for connecting to the ground potential are formed to pass through the interlayer insulating film. Source regions of the drive MOS transistors are connected to the ground potential wiring patterns (not shown) via the contact holes 106-1 and 106-2. Contact holes 108-1 and 108-2 for connecting to power supply potential pattern are formed and the power is supplied to the load MOS transistors via the contact holes 108-1 and 108-2. Subsequently, contact holes 107-1, 107-2, 109-1 and 109-2 are formed and contacts 107-1 and 109-1 are connected by a pattern (not shown). As a result, the drain region of the drive MOS transistor, the load/drive gate electrode 104-2 and the drain region of the load MOS transistor are electrically connected. Similarly, a pattern (not shown) is formed between the connection contact holes 107-2 and 109-2. As a result, the drain region of the load MOS transistor, the load/drive gate electrode 104-1 and the drain region of the drive MOS transistor are electrically connected. Further, contact holes 110-1 and 110-2 for bit lines are formed.

In this manner, at least 10 contact holes are required in the conventional CMOS type static memory cell as shown in FIG. 1. The connection contact hole 107-1 is formed over the drain region of the drive MOS transistor formed in the silicon active region 102-1 and the gate electrode 104-2. Similarly, the connection contact hole 109-2 is formed over the drain region of the load MOS transistor formed in the silicon active region 103-2 and the gate electrode 104-1.

Next, a method of forming the contact holes will be described with reference to FIGS. 2A to 2F. Referring to FIG. 2A, an element isolation insulating film 202 is selectively formed on the surface of a silicon substrate 201. Subsequently, a gate insulating film 203 is formed for the load MOS transistors. Then, polyside film 204 is deposited and the first resist mask 205 is formed. Next, the polyside film 204 is etched by a dry etching method using the first resist mask 205. Thus, load/drive gate electrodes 206 and 206a are formed as shown in FIG. 2B.

Next, a silicon oxide film is deposited on the entire surface and then anisotropic etching is executed wholly by a dry etching method. As a result, side wall insulating films 207 are formed on the side wall of the load/driving gate electrodes 206 and 206a, as shown in FIG. 2C. Subsequently, P-type diffusion layers 208 are formed through ion implantation of boron and heat treatment. The P-type diffusion layers 208 function as the source/drain regions of the load MOS transistor.

Next, as shown in FIG. 2D, an interlayer insulating film 209 is formed. Then, the second resist mask 210 is formed. The interlayer insulating film 209 is etched by a dry etching method using the second resist mask 210 to form contact holes. A contact hole overhanging the load/drive gate electrode 206a and the diffusion layers 208 is also formed. This contact hole corresponds to the connection contact hole 109-2 in FIG. 1.

Next, as shown in FIG. 2E, a metal thin film 211 is formed and the third resist mask 212 is formed. The metal thin film 211 is etched by a dry etching method using the third resist mask 212. As a result, connection pattern 108-2, 109-2, 109-1 and 108-1 are formed as shown in FIG. 2F.

In the conventional method of forming the contacts, as described above, it is difficult to form the side wall insulating films on the side walls of the gate electrode of the MOS transistor and to form the contact holes on the source/drain regions of gate electrode of the MOS transistor. For this reason, in a case of high density SRAM in which many contact holes are to be formed, it is difficult to reduce the size of a memory cell.

SUMMARY OF THE INVENTION

Therefore, the present invention has, as an object, to provide a method for forming contacts in a self-alignment manner in a semiconductor device.

Another object of the present invention is to provide a method for manufacturing a semiconductor device having a chip size reduced.

In order to achieve an aspect of the present invention, a method of manufacturing a semiconductor device, includes the steps of:

forming laminate structures with a first insulating film as a top film on a semiconductor region having a first conductive type, wherein one of the laminate structures is a gate electrode structure including a second insulating film as a gate insulating film formed on the semiconductor region, a conductive layer as a gate electrode formed on the gate insulating film, and the first insulating film formed on the gate electrode;

forming side wall insulating films on side walls of the gate electrode structure and laminate structures adjacent to the gate electrode structure; and forming contacts for source/drain regions formed between the gate electrode structure and the adjacent laminate structures, using the side walls in a self-alignment manner.

In the present invention, the method may further includes the step of executing ion implantation of impurity of a second conductive type different from the first conductive type using the side wall insulting films to produce the source/drain regions for a metal-oxide-semiconductor (MOS) transistor, before the step of forming contacts. In this case, the side wall insulating films are used for self-alignment formation of the source/drain regions and contacts. The laminate structures are formed by forming the second insulating film, by depositing the conductive layer, by depositing the first insulating film, and then by patterning the second insulating film, the conductive layer and the first insulating film to produce the laminate structures.

When the semiconductor device includes two MOS transistors and a gate of one of the two MOS transistors is connected to a source/drain regions of the other MOS transistor, the method may further include the step of forming an element isolation insulating film on the semiconductor region between the two MOS transistors. In this case, one of the laminate structures is formed on the element isolation insulating film whose conductive layer is connected to the conductive layer of the gate electrode structure of the one MOS transistor, and the one laminate structure includes the first insulating film covering a portion of the conductive layer of the laminate structure on the element isolation insulating film. Also, the contacts for the source/drain regions for the two MOS transistors are formed using the side walls in a self-alignment manner such that the contact for one of the source/drain regions of the other MOS transistor is connected to the conductive layer of the laminate structure on the element isolation insulating film via a portion of the conductive layer where the first insulating film is not covered.

In the present invention, the method may further include forming a third insulating film having an etching rate higher than those of the first insulating film and side wall insulating film, and selectively etching the third insulating film to form contact holes for the contacts. The third insulating film may be formed by coating a spin on glass (SOG) film or by depositing the third insulating film containing boron or phosphorous impurity, and executing a chemical mechanical polishing to the third insulating film.

For the formation of side wall insulating films, an insulating film for the side wall insulating films is first formed, and then selectively dry etched. In this case, because the insulating film for the side wall insulating film has an etching rate higher than the first insulating film, the first insulating film is not etched. The first insulating film prevents a metal film for the contacts from being connected to the conductive layer of the gate electrode structure. The first insulating film may be formed of a silicon oxide film containing excess silicon atoms of 5 to 10 atomic % and the side wall insulating films are formed of a silicon oxide film. The first insulating film may be formed of a silicon nitride film and the side wall insulating films are formed of a silicon oxide film containing impurity of boron or phosphorous.

In order to achieve another aspect of the present invention, a method of manufacturing a semiconductor device, includes the steps of:

forming laminate structures with a first insulating film as a top film on a semiconductor region having a first conductive type, wherein one of the laminate structures is a gate electrode structure including a second insulating film as a gate insulating film formed on the semiconductor region, a conductive layer as a gate electrode formed on the gate insulating film, and the first insulating film formed on the gate electrode;

forming side wall insulating films on side walls of the gate electrode structure and laminate structures adjacent to the gate electrode structure;

executing ion implantation of impurity of a second conductive type different from the first conductive type using the side wall insulting films in a self-alignment manner to produce the source/drain regions for a metal-oxide-semiconductor (MOS) transistor; and forming contacts for source/drain regions formed between the gate electrode structure and the adjacent laminate structures, using the side walls in a self-alignment manner.

DESCRIPTION OF THE PREFERRED EMBODIMENTS

The semiconductor device according to the present invention will be described below in detail with reference to the accompanying drawings.

Figure 1:
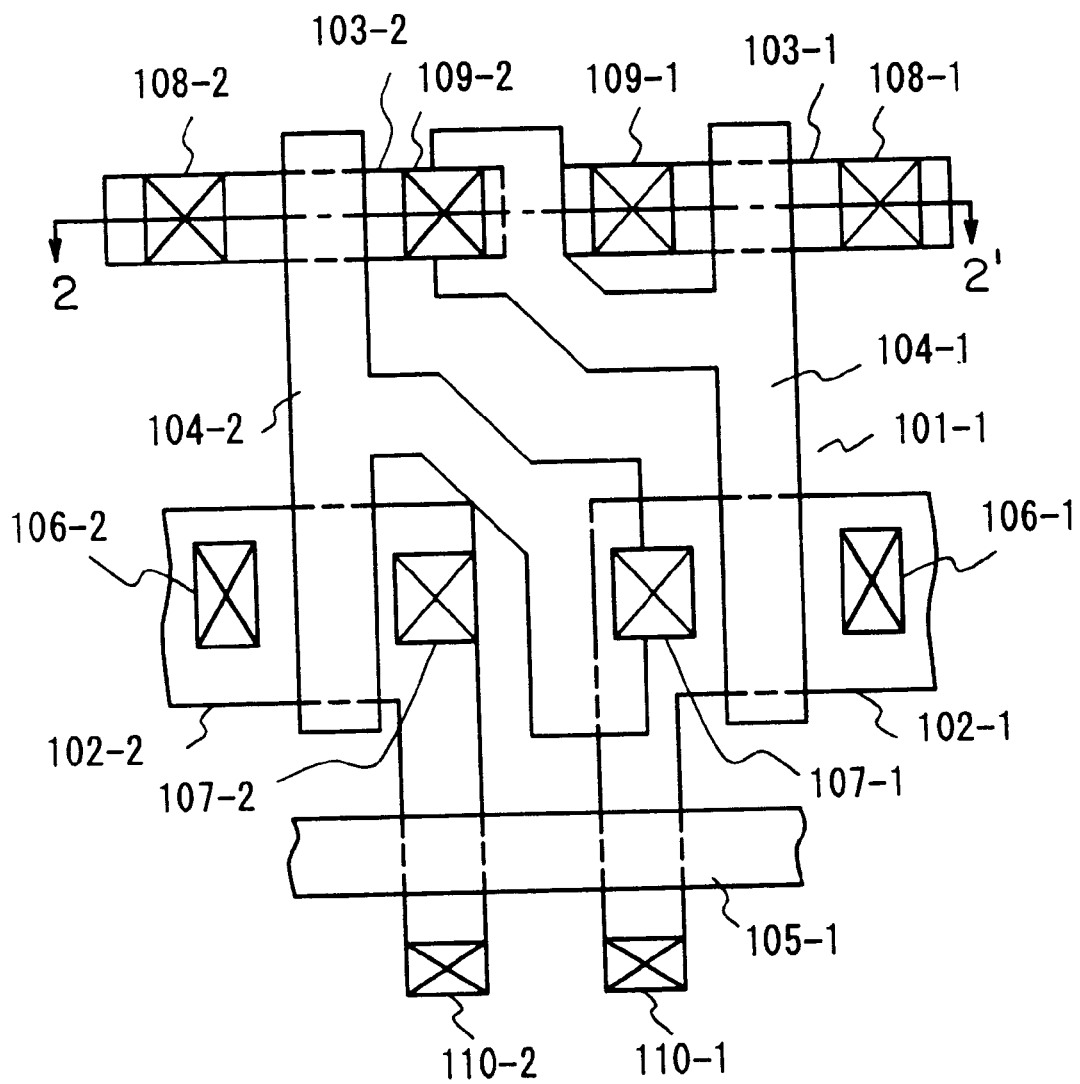
FIG. 1 is a plan view of a memory cell of a conventional static random access memory (SRAM)
Figure 2A:
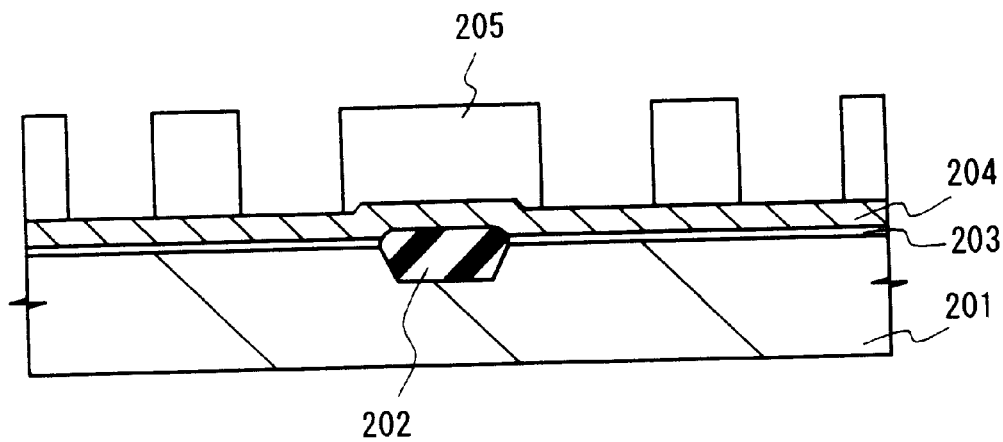
FIGS. 2A to 2F are cross sectional view of the memory cell of the conventional SRAM in the manufacturing processes cut along a line 2–2'.
Figure 2B:
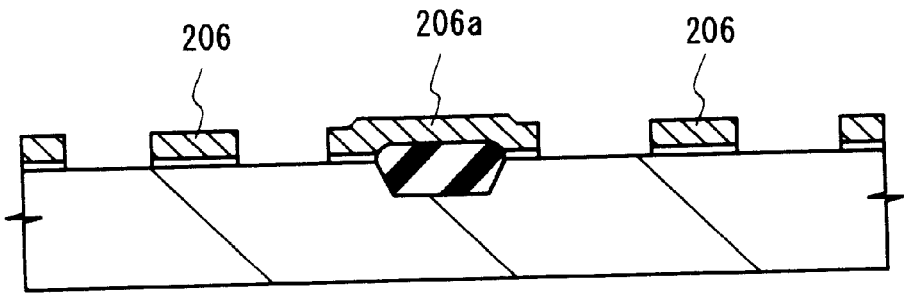
Figure 2C:
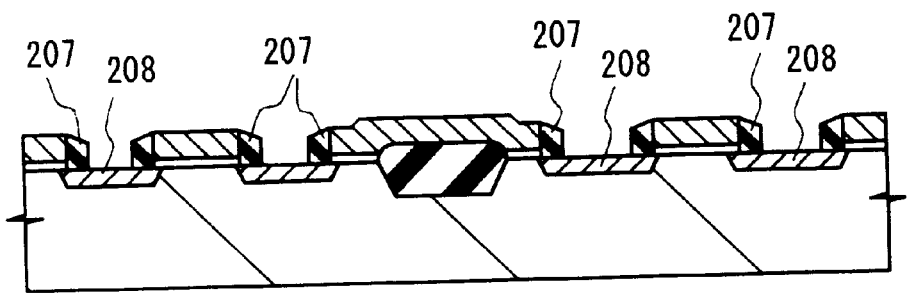
Figure 2D:
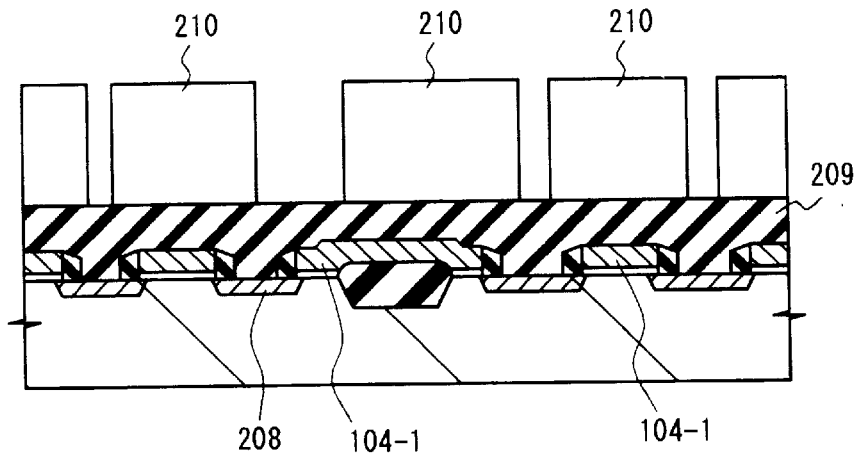
Figure 2E:
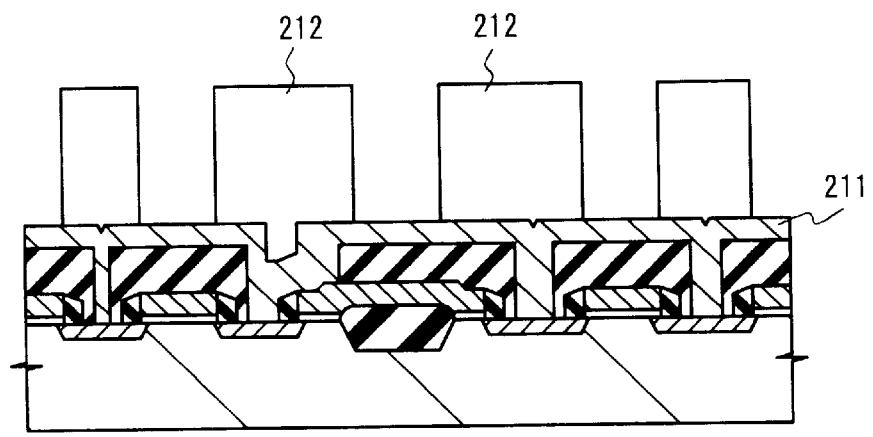
Figure 2F:
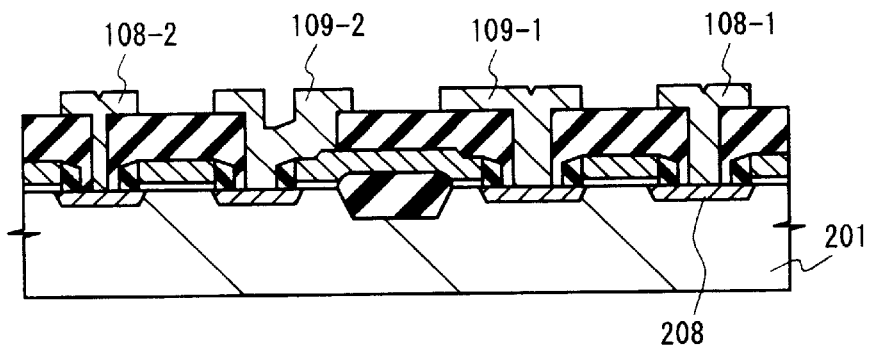
Figure 3:
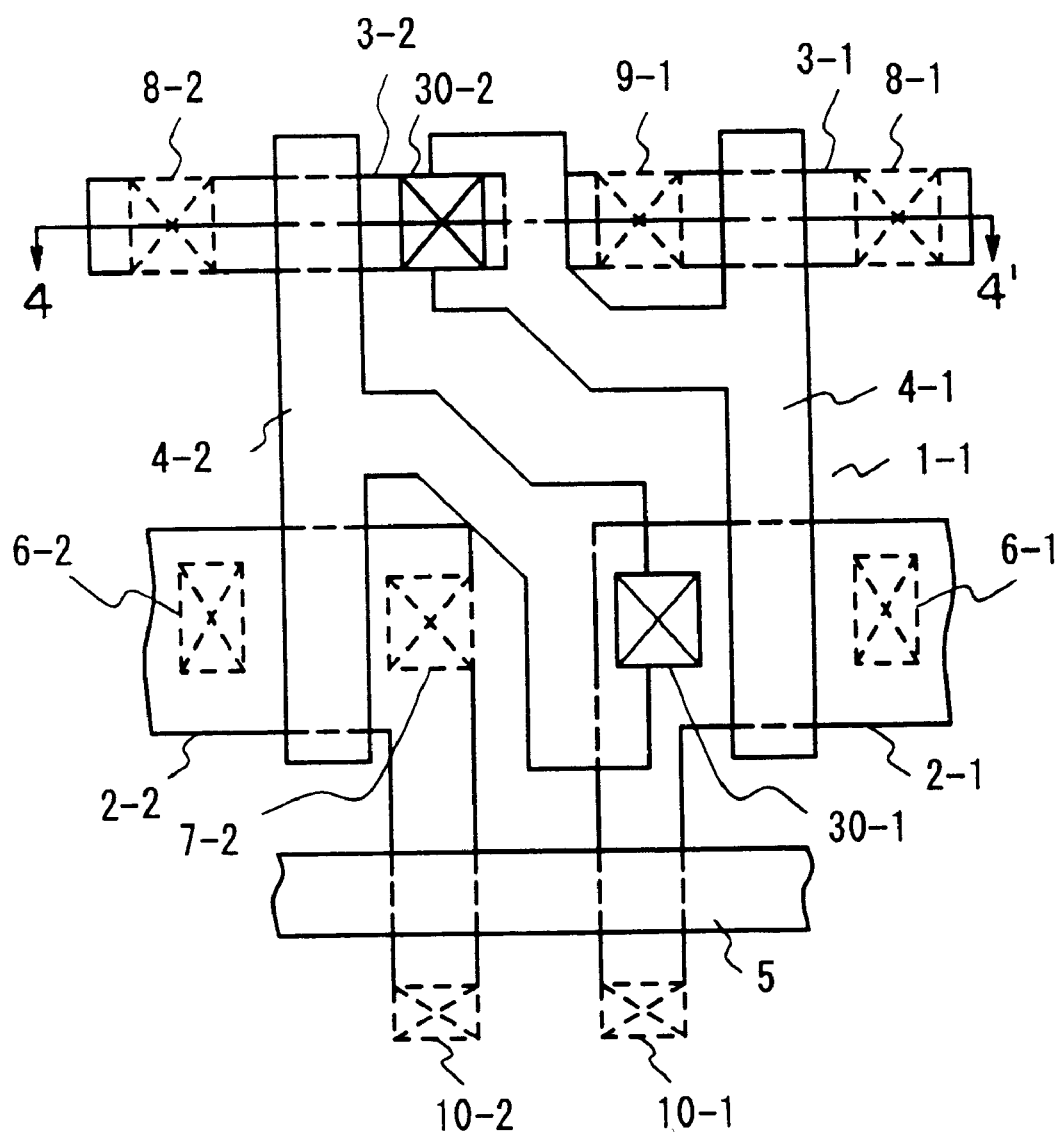
FIG. 3 is a plan view of a memory cell of a static random access memory (SRAM) manufactured by a method of the present invention.

FIG. 3 is a plan view of the semiconductor device according to the first embodiment of the present invention. FIGS. 4A to 4G are cross sectional views cut along a line 4–4' of the semiconductor device shown in FIG. 3 in the manufacturing processes.

Referring to FIG. 3, silicon active regions 2-1, 2-2, 3-1 and 3-2 surrounded by an element isolation insulating film 1-1 are formed on the surface of a P-type semiconductor (silicon) substrate or a P-type well. Then, a gate electrode 4-1 for a drive MOS transistor and a gate electrode 4-2 for a load MOS transistor are provided. Further, a word line 5 is formed as functioning as a gate electrode of a transfer MOS transistor. N-type Diffusion layers of source/drain regions of the drive MOS transistors and transfer MOS transistor are formed by executing ion implantation of Arsenic (As) into a region of the above-mentioned silicon active regions 2-1 and 2-2 other than the region where the gate electrodes are formed. Further, P-type diffusion layers for source/drain regions of the load MOS transistors are formed by executing ion implantation of boron (B) into a region of the silicon active regions 3-1 and 3-2.

Next, a silicon oxide film is deposited on the entire surface and then anisotropic dry etching is executed to form contact holes in self-alignment with the element isolation insulating film 1-1, gate electrodes 4-1 and 4-2 and word line 5 as the semiconductor element patterns. In order to form the contact hole over both of the drain region of the drive MOS transistor and the gate electrode region, a connection contact hole 30-1 is provided in advance. Similarly, a connection contact hole 30-2 is provided for the contact hole over both of the drain region of the load MOS transistor and the gate electrode region. In this manner, the plane structure of the static memory cell of the present invention is formed such that the ground contact hole, power supply contact hole, connection contact hole and bit line contact hole are formed in a self-alignment manner.

Next, the method of manufacturing the semiconductor device with the contact holes will be described below with reference to FIGS. 4A to 4G. In the embodiment, the semiconductor device is formed with 0.5 μm design rule.

Figure 4A:
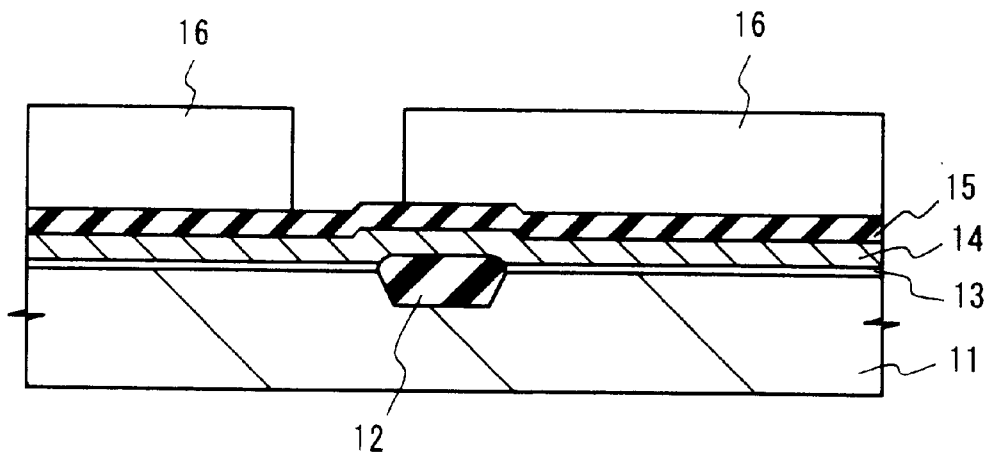
FIGS. 4A to 4G are cross sectional view of the memory cell of the conventional SRAM cut along a line 4–4' in the manufacturing processes according to a first embodiment of the present invention.

Referring to FIG. 4A, first, the element isolation insulating film 12 is selectively formed on the surface of a silicon substrate 11. The element isolation insulating film 12 is a silicon oxide film having the thickness as much as 40 nm. Then, a gate insulating film 13 is formed for the MOS transistor to have the thickness as much as 10 nm.

Next, tungsten polyside film 14 is deposited to have the thickness of about 200 nm and then a thin insulating film 15 are formed as the first insulating film to cover the tungsten polyside film 14. The thin insulating film 15 is deposited by a chemical vapor deposition (CVD) method to have the thickness of about 300 nm. The thin insulating film 15 is a silicon oxide film containing excess silicon atoms (to be referred to as an SRO film hereinafter).

A method of forming the SRO film will be briefly described below. In a reduced pressure CVD furnace reducible in pressure and including a quartz reaction tube, the furnace is heated to 700° C. to 800° C. by a heater. Monosilane gas and dinitrogen monoxide gas are introduced into the furnace from separate gas inlets as reaction gases. Nitrogen gas is used as the ambient gas. The total pressure of these gases is about 1 Torr. By the forming method, excess silicon atoms are contained in the silicon dioxide film. For this purpose, a ratio of a gas flow rate of monosilane gas and that of dinitrogen monoxide is changed. The amount of excess silicon atoms increases if the monosilane gas flow rate is increased. Thus, the thin silicon oxide film containing the excess silicon atoms, i.e., SRO film 15 is formed. The SRO film 15 is insulator having the structure in which small silicon aggregations are dispersedly mixed in silicon dioxide ($SiO_2$). In the embodiment, the SRO film containing excess silicon atoms of 5 to 10 atomic % is used.

Next, the first resist mask 16 is formed. A part of the thin insulating film 15 is etched using the first resist mask 16. In this manner, the connection contact hole 30-2 described with reference to FIG. 3 is formed.

Figure 4B:
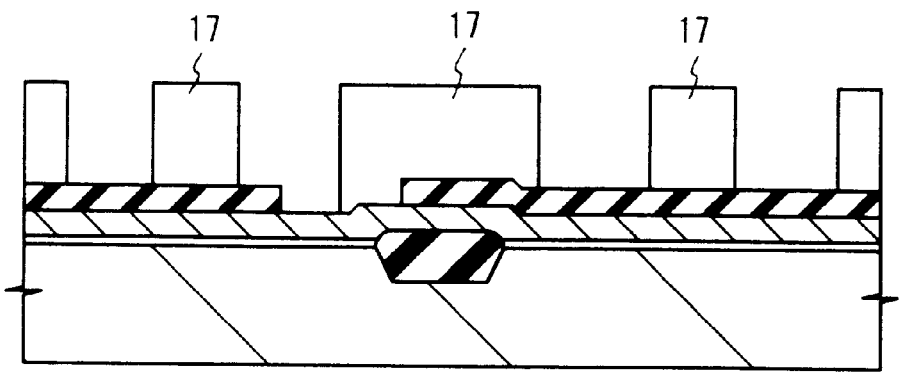
Figure 4C:
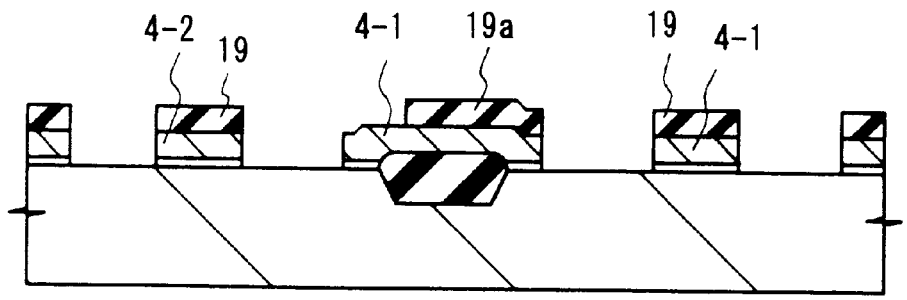

Next, as shown in FIG. 4B, the second resist mask 17 is formed. Subsequently, the, the first insulating film 15, the tungsten polyside film 14 and the gate insulating film 13 are dry etched using the second resist mask 17. Thus, the gate electrode structures including gate electrode 4-1 and 4-2 are formed as shown in FIG. 4C. Each of the gate electrode structures has the first insulating film as a protection insulating films 19 on the gate electrodes 4-1 and 4-2. The protection insulating film 19a is formed on the gate electrode 4-1 above the element isolation insulating film to cover a part of the gate electrode 4-1.

Figure 4D:
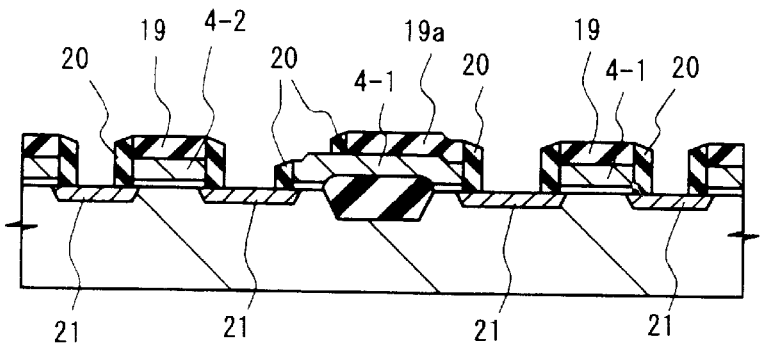

Next, a silicon oxide film is deposited on the entire surface as the second insulating film having the thickness of 200 nm by a CVD method and then anisotropic etching is executed wholly by a dry etching method. Reaction gas used in the dry etching is mixture of $C_4F_8$ and CO. By the reaction gas, the SRO film is not almost etched and the silicon oxide film is selectively etched. In this manner, side wall insulating films 20 are formed on the side wall of the gate electrode 4-1 and 4-2 and the side walls of the protection insulating film 19 and 19a, as shown in FIG. 4D. Subsequently, P-type diffusion layers 21 are formed through ion implantation of boron and heat treatment. The P-type diffusion layers 21 function as the source/drain regions of the MOS transistors.

Figure 4E:
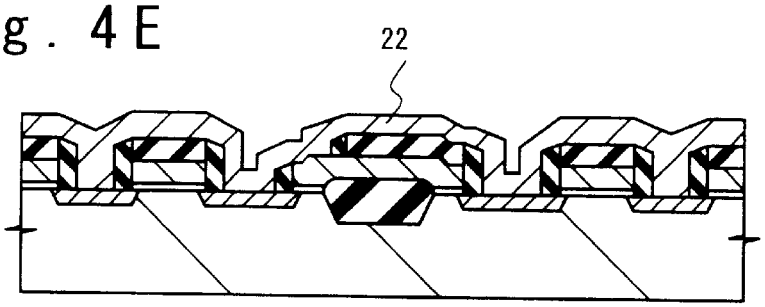
Figure 4F:
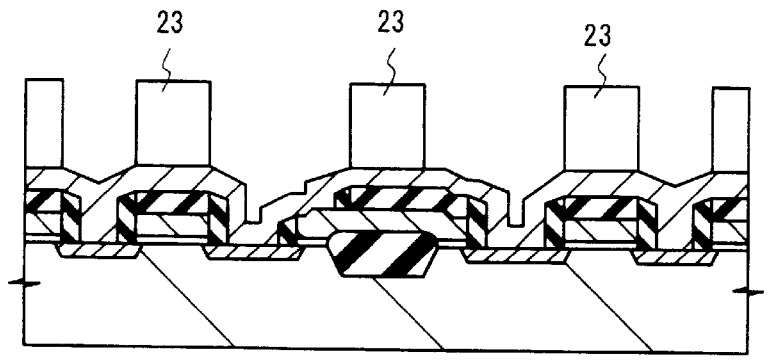
Figure 4G:
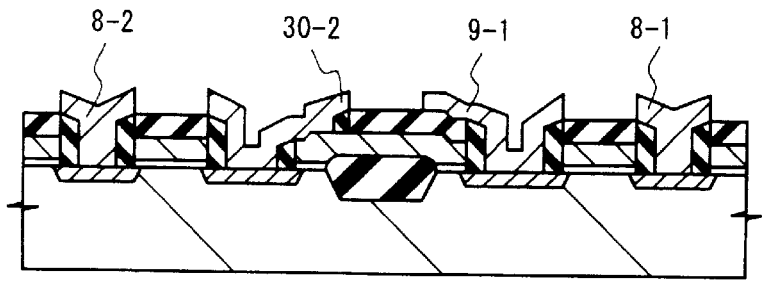

Next, as shown in FIG. 4E, a metal thin film 22 is formed. The metal thin film 22 is a metal film by laminating a titanium layer, titanium nitride layer and tungsten layer. Subsequently, the third resist mask 23 is formed as shown in FIG. 4F. The metal thin film 22 is etched using the third resist mask 23 so that contacts 8-1, 8-2, 9-1 and 30-2 are formed for the connection wiring pattern and power supply wiring pattern.

By the above-mentioned processes, the contacts of the static type memory cell having a CMOS structure are formed in a self-alignment manner. The chip area of the memory cell having the self-alignment type contact holes is reduced by 20% or more, compared to that of the memory cell formed using the conventional technique.

Next, the static RAM according to the second embodiment of the present invention will be described with reference to FIGS. 5A to 5D. In the second embodiment, the self-alignment type contact holes are selectively formed. The processes until the gate electrode structures are formed and the protection insulating film 19 and 19a are formed are the same as those in the first embodiment, as shown in FIG. 4C. FIGS. 5A to 5D show the subsequent processes.

As described above, the gate electrode 4-1 and 4-2 are formed and the protection insulating films 19 and 19a are formed on these gate electrodes. The protection insulating film 19a is formed on the gate electrode 4-1 to cover a part of the gate electrode. Subsequently, the silicon oxide film is deposited on the entire surface of 250 nm in thick and the anisotropic dry etching is executed. Thus, the side wall insulating films 20 are formed on the side walls of the gate electrode structures of the gate electrodes 4-1 and 4-2 and the side walls of the laminate structure having the protection insulating film 19a and formed on the element isolation insulating film. Then, P-type diffusion layers 21 are formed through ion injection of boron and heat treatment. The P-type diffusion layers 21 function as the source/drain regions of the MOS transistors.

Next, a flattening insulating film 26 is formed on the entire surface as the third insulating film. The flattening insulating film 26 is formed of material having a higher etching rate in dry etching than the protection insulting film 19 and 19a and the side wall insulating films 20. For instance, a spin on glass (SOG) film which is formed by a coating method or a silicon oxide film flattened by a chemical mechanical polishing method and containing boron or phosphorus as impurity is used as the flattening insulating film 26. A silicon oxide film having the thickness as much as 5 nm may be formed under the buried insulating film 26.

Figure 5A:
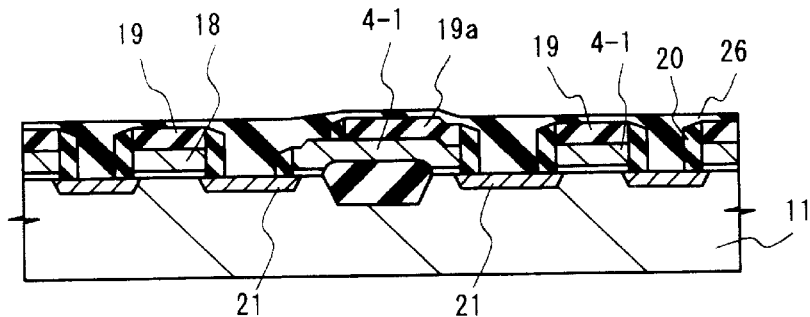
FIGS. 5A to 5D are cross sectional view of the memory cell of the conventional SRAM cut along the line 4–4' in the manufacturing processes according to a second embodiment of the present invention.
Figure 5B:
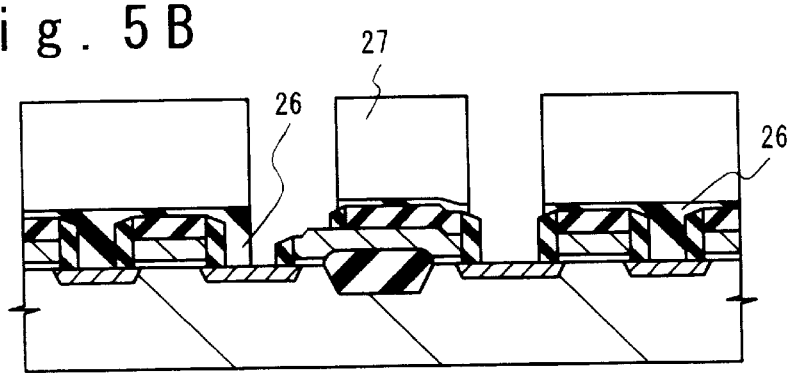

Next, the fourth resist mask 27 is formed as shown FIG. 5B. The flattening insulating film 26 is selectively etched by a dry etching method using the fourth resist mask 27. Reaction gas used for the dry etching is mixture of $CHF_3$ and CO.

Figure 5C:
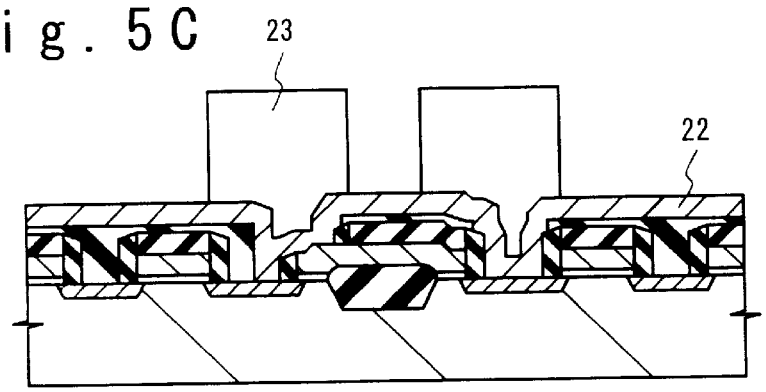
Figure 5D:
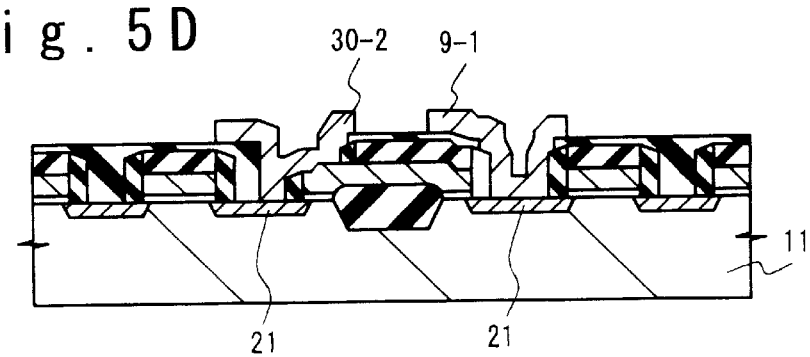

Next, a metal thin film 22 is formed as shown in FIG. 5C. The metal thin film 22 is a metal film by laminating a titanium layer, titanium nitride layer and tungsten layer. Subsequently, the third resist mask 23 is formed. The metal thin film 22 is etched by a dry etching method using the third resist mask 23 to form the connection wiring patterns 30-2 and 9-1.

As described above, the static type memory cell of a CMOS structure having self-alignment contact holes are formed. Because the protection insulating films and side wall insulating films which both have a low etching rate compared to that of the insulating film 26, the accurate position where a contact hole is to be formed can be determined by the protection insulating film and the side wall insulating films. The second embodiment has advantages in a case where a position for a contact to be formed is strictly determined.

In the above embodiments, the case is described where the present invention is applied to the static type memory cell. However, the present invention is not limited to these cases. When the present invention is applied to a semiconductor device portion other than the static type memory cell, e.g., a peripheral circuit section of an SRAM or DRAM, the same advantages are obtained.

Further, a silicon nitride film, a silicon oxide film containing boron or phosphorous as impurity, and an organic insulating film such as polyimide may be used as the first insulating film, the second insulating film and third insulating film, respectively.

As described above, according to the present invention, self-alignment type contact holes are formed on the source/drain regions of a MOS transistor. Further, other self-alignment type contact holes are formed on the gate electrode of the MOS transistor on the same process. Furthermore, a common contact hole over the gate electrode and the source/drain region of the MOS transistor is formed in self-alignment. For this reason, a margin for the contact holes becomes unnecessary and restriction in reducing the size of a semiconductor device due to the margin is removed. Therefore, high density integration of the semiconductor device is made easy so that the operation speed of the semiconductor device is increased and the price of the semiconductor device is decreased. This is remarkable, specifically, in the SRAM.

What is claimed is:

1. A method of manufacturing a semiconductor device, comprising:

forming laminate structures with a first insulating film as a top film on a semiconductor region having a first conductive type, wherein at least one of said laminate structures is a gate electrode structure including a second insulating film as a gate insulating film formed on said semiconductor region, a conductive film as a gate electrode formed on said gate insulating film, and said first insulating film formed on said gate electrode;

forming side wall insulating films on side walls of said gate electrode structure and laminate structures adjacent to said gate electrode structure; and forming contacts for source/drain regions formed between said gate electrode structure and said adjacent laminate structures, using said side walls in a self-alignment manner, and wherein said forming laminate structures includes:
   (i) depositing said second insulating film;
   (iii) depositing said conductive film on said second insulating film;
   (iii) depositing said first insulating film on said conductive film;
   (iv) patterning said first insulating film thereby uncovering a first portion of said conductive film; and
   (v) patterning said first insulating film, said conductive film and said second insulating film to produce said laminate structures.

2. A method according to claim 1, further comprising executing ion implantation of impurity of a second conductive type different from said first conductive type using said side wall insulating films to produce said source/drain regions for a metal-oxide-semiconductor (MOS) transistor, before said step of forming contacts.

3. A method according to claim 1, wherein said semiconductor device includes two MOS transistors and a gate of one of said two MOS transistors is connected to one of source/drain regions of the other MOS transistor, wherein said method further comprises forming an element isolation insulating film on said semiconductor region between said two MOS transistors, wherein one of said laminate structures is formed on said element isolation insulating film whose conductive film is connected to the conductive film of said gate electrode structure of said one MOS transistor, and said one laminate structure includes said first insulating film covering a second portion of the conductive film of said laminate structure on said element isolation insulating film, wherein said forming contacts includes forming the contacts for said source/drain regions for said two MOS transistors using said side walls in a self-alignment manner, and wherein the contact for one of said source/drain regions of said other MOS transistor is connected to the conductive film of said laminate structure on said element isolation insulating film via said first portion of the conductive film not covered by said first insulating film.

4. A method according to claim 1, further comprising:

forming a third insulating film having an etching rate higher than those of said first insulating film and side wall insulating film; and selectively etching said third insulating film to form contact holes for the contacts.

5. A method according to claim 4, wherein said forming a third insulating film includes coating a spin on glass (SOG) film.

6. A method according to claim 4, wherein said forming a third insulating film includes:

depositing said third insulating film containing boron or phosphorous impurity; and executing a chemical mechanical polishing to said third insulating film.

7. A method according to claim 1, wherein said forming side wall insulating films includes:

depositing an insulating film for said side wall insulating films; and selectively dry etching the insulating film for said side wall insulating film, the insulating film for said side wall insulating film having an etching rate higher than said first insulating film.

8. A method according to claim 7, wherein said first insulating film is formed of a silicon oxide film containing excess silicon atoms and said side wall insulating films are formed of a silicon oxide film.

9. A method according to claim 8, wherein said silicon oxide film containing excess silicon atoms includes excess silicon atoms of 5 to 10 atomic %.

10. A method according to claim 7, wherein said first insulating film is formed of a silicon nitride film and said side wall insulating films are formed of a silicon oxide film containing impurity of boron or phosphorous.

11. A method of manufacturing a semiconductor device, comprising the steps of:
   forming laminate structures with a first insulating film as a top film on a semiconductor region having a first conductive type, wherein at least one of said laminate structures is a gate electrode structure including a second insulating film as a gate insulating film formed on said semiconductor region, a conductive film as a gate electrode formed on said gate insulating film, and said first insulating film formed on said gate electrode;
   forming side wall insulating films on side walls of said gate electrode structure and laminate structures adjacent to said gate electrode structure;
   executing ion implantation of impurity of a second conductive type different from said first conductive type using said side wall insulting films in a self-alignment manner to produce said source/drain regions for a metal-oxide-semiconductor (MOS) transistor; and
   forming contacts for source/drain regions formed between said gate electrode structure and said adjacent laminate structures, using said side walls in a self-alignment manner, and
   wherein said forming laminate structures includes:
     (i) depositing said second insulating film;
     (ii) depositing said conductive film on said second insulating film;
     (iii) depositing said first insulating film on said conductive film;
     (iv) patterning said first insulating film thereby uncovering a first portion of said conductive film; and
     (v) patterning said first insulating film, said conductive film and said second insulating film to produce said laminate structures.

12. A method according to claim 11, wherein said semiconductor device includes two MOS transistors and a gate of one of said two MOS transistors is connected to one of source/drain regions of the other MOS transistor,
   wherein said method further comprises forming an element isolation insulating film on said semiconductor region between said two MOS transistors,
   wherein one of said laminate structures is formed on said element isolation insulating film whose conductive film is connected to the conductive film of said gate electrode structure of said one MOS transistor, and said one laminate structure includes said first insulating film covering a second portion of the conductive film of said laminate structure on said element isolation insulating film,
   wherein said forming contacts includes forming the contacts for said source/drain regions for said two MOS transistors using said side walls in a self-alignment manner, and wherein the contact for one of said source/drain regions of said other MOS transistor is connected to the conductive film of said laminate structure on said element isolation insulating film via said first portion of the conductive film not covered by said first insulating film.

13. A method according to claim 11, further comprising:
   depositing a third insulating film having an etching rate higher than those of said first insulating film and side wall insulating film; and
   selectively etching said third insulating film to form contact holes for the contacts.

14. A method of manufacturing a semiconductor device comprising an insulated gate type field effect transistor and a wiring pattern connected to one of source/drain regions, comprising:
   forming a first insulating film on a semiconductor substrate of a first conductive type;
   forming a conductive film on said first insulating film for a gate electrode of said insulated gate type field effect transistor and said wiring pattern;
   forming a second insulating film on said conductive film;
   removing a first part of said second insulating film on said conductive film to form said wiring pattern;
   forming a resist layer on said second insulating film and said conductive film such that a gate electrode of said insulated gate type field effect transistor and said wiring pattern are defined and such that a part of said wiring pattern where said second insulating film is removed is adjacent to one of said source/drain regions;
   removing a second part of said second insulating film and a part of said conductive film other than where said resist layer is formed;
   forming side wall insulating films on side walls of said second insulating film and said conductive film;
   forming said source/drain using said side wall insulating films as a mask; and
   forming a metal film on said one of said source/drain and said part of said wiring pattern where said second insulating film is removed, using said side wall insulating films as a mask.

15. A method according to claim 14, wherein said forming said source/drain includes executing ion implantation of impurity of a second conductive type different from said first conductive type.

16. A method according to claim 14, wherein said semiconductor device includes a first and a second insulated gate type field effect transistors and a gate of one of said first and second transistors is connected to one of source/drain regions of the other of said first and second transistors wherein said method further comprises:
   forming an element isolation insulating film on said semiconductor substrate between said first and second transistors, wherein said wiring portion is formed on said element isolation insulating film,
   wherein said step of forming metal film includes forming contacts for said source/drain regions of said first and second transistors using said side wall insulating films in a self-alignment manner.

17. A method according to claim 14, wherein said forming side wall insulating films includes:
   depositing an insulating film for said side wall insulating films; and
   selectively dry etching the insulating film for said side wall insulating films, the insulating film for said side wall insulating films having an etching rate higher than said first insulating film.

18. A method according to claim 17, wherein said first insulating film is formed of a silicon oxide film containing excess silicon atoms and said side wall insulating films are formed of a silicon oxide film.

19. A method according to claim 18, wherein said silicon oxide film containing excess silicon atoms includes excess silicon atoms of 5 to 10 atomic %.

20. A method according to claim 17, wherein said first insulating film is formed of a silicon nitride film and said side wall insulating films are formed of a silicon oxide film containing impurity of boron or phosphorous.

21. A method of manufacturing a semiconductor device comprising an insulated gate type field effect transistor and a wiring pattern connected to one of source/drain regions, comprising:

forming a first insulating film on a semiconductor substrate of a first conductive type;

forming a conductive film on said first insulating film for a gate electrode of said insulated gate type field effect transistor and said wiring pattern;

forming a second insulating film on said conductive film;

removing a first part of said second insulating film on said conductive film to form said wiring pattern;

forming a resist layer on said second insulating film and said conductive film such that a gate electrode of said insulated gate type field effect transistor and said wiring pattern are defined and such that a part of said wiring pattern where said second insulating film is removed is adjacent to one of said source/drain regions;

removing a second part of said second insulating film and a part of said conductive film other than where said resist layer is formed;

forming side wall insulating films on side walls of said second insulating film and said conductive film;

forming said source/drain using said side wall insulating films as a mask;

forming a third insulating film having an etching rate higher than those of said first insulating film and side wall insulating film;

selectively etching said third insulating film to form at least one contact hole; and forming a metal film in contact, via said contact hole, with said one of said source/drain and said part of said wiring pattern where said second insulating film is removed.

22. A method according to claim 21, wherein said forming a third insulating film includes coating a spin on glass (SOG) film.

23. A method according to claim 21, wherein said forming a third insulating film includes:

depositing said third insulating film containing boron or phosphorous impurity; and executing a chemical mechanical polishing to said third insulating film.

* * * * *